US008581673B2

(12) United States Patent
Ishiyama et al.

(10) Patent No.: US 8,581,673 B2
(45) Date of Patent: Nov. 12, 2013

(54) CIRCUIT MODULE

(75) Inventors: Yoshiyuki Ishiyama, Nagaokakyo (JP);
Yasuhiro Takahashi, Nagaokakyo (JP);
Koji Furutani, Nagaokakyo (JP)

(73) Assignee: Murata Manufacturing Co., Ltd.,
Kyoto (JP)

( * ) Notice: Subject to any disclaimer, the term of this patent is extended or adjusted under 35 U.S.C. 154(b) by 0 days.

(21) Appl. No.: 13/541,851

(22) Filed: Jul. 5, 2012

(65) Prior Publication Data
US 2013/0176083 A1    Jul. 11, 2013

Related U.S. Application Data

(63) Continuation of application No. PCT/JP2011/050031, filed on Jan. 6, 2011.

(30) Foreign Application Priority Data
Jan. 7, 2010  (JP) ................................. 2010-001924

(51) Int. Cl.
H01P 1/387 (2006.01)
H01P 1/36 (2006.01)

(52) U.S. Cl.
USPC ......................................... 333/1.1; 333/24.2

(58) Field of Classification Search
USPC .................................................. 333/1.1, 24.2
See application file for complete search history.

(56) References Cited

U.S. PATENT DOCUMENTS

| | | | |
|---|---|---|---|
| 6,208,218 B1 | 3/2001 | Ishiura et al. | |
| 7,227,427 B2 * | 6/2007 | Kawanami | 333/1.1 |
| 2006/0022766 A1 | 2/2006 | Ishigaki et al. | |
| 2009/0293272 A1 | 12/2009 | Taguchi | |

FOREIGN PATENT DOCUMENTS

| | | |
|---|---|---|
| JP | 2000-59111 A | 2/2000 |
| JP | 2001-339260 A | 12/2001 |
| JP | 2003-101432 A | 4/2003 |
| JP | 2004-320491 A | 11/2004 |
| JP | 2006-49969 A | 2/2006 |
| JP | 2006-279603 A | 10/2006 |
| JP | 2006-279604 A | 10/2006 |
| JP | 2006-311455 A | 11/2006 |
| JP | 2008-271525 A | 11/2008 |
| JP | 2009-290285 A | 12/2009 |
| JP | 2009-290286 A | 12/2009 |

OTHER PUBLICATIONS

Official Communication issued in International Patent Application No. PCT/JP2011/050031, mailed on Apr. 19, 2011.

* cited by examiner

Primary Examiner — Stephen Jones
(74) Attorney, Agent, or Firm — Keating & Bennett, LLP

(57) ABSTRACT

In a circuit module in which a plurality of non-reciprocal circuit elements, each of which does not have a yoke, are mounted, the occurrence of magnetic coupling between the non-reciprocal circuit elements is significantly reduced and prevented. Core isolators are not arranged such that, in a state in which the direction of magnetic flux and the direction of magnetic flux are the same, the core isolators are aligned in the direction of the magnetic flux. Specifically, the core isolators generate the magnetic flux from left to right. The core isolators are aligned so as to be inclined relative to the magnetic flux. Thus, extension of the magnetic flux through the core isolator in a state of being directed in the same direction as that of the magnetic flux is significantly reduced and prevented.

11 Claims, 5 Drawing Sheets

CIRCUIT MODULE

BACKGROUND OF THE INVENTION

1. Field of the Invention

The present invention relates to a circuit module, and more specifically, relates to a circuit module in which a plurality of non-reciprocal circuit elements are provided.

2. Description of the Related Art

As an existing non-reciprocal circuit element, for example, a non-reciprocal circuit element described in Japanese Unexamined Patent Application Publication No. 2006-311455 is known. The non-reciprocal circuit element includes a ferrite having a pair of opposing principal surfaces, a plurality of center electrodes, permanent magnets having principal surfaces facing the principal surfaces of the ferrite, and a circuit board. The plurality of center electrodes are formed from a conductor film in a state of being insulated from the principal surfaces of the permanent magnets and intersecting each other, and are electrically connected via intermediate electrodes formed on end surfaces orthogonal to the principal surfaces of the ferrite. Furthermore, the ferrite and the permanent magnets are disposed on the circuit board such that the principal surfaces thereof are orthogonal to the surface of the circuit board. The non-reciprocal circuit element described above is used, for example, in a communication apparatus or the like.

Meanwhile, in recent years, with demand for size reduction of communication apparatuses, size reduction of non-reciprocal circuit elements have been increasingly demanded. Thus, it is proposed to remove a yoke for suppressing leakage of magnetic flux to the outside, in the non-reciprocal circuit element described in Japanese Unexamined Patent Application Publication No. 2006-311455.

However, when the yoke is removed from the non-reciprocal circuit element, magnetic flux leaks around the non-reciprocal circuit element. Since a communication apparatus is provided with a plurality of non-reciprocal circuit elements, if leakage of magnetic flux occurs, the non-reciprocal circuit elements are magnetically coupled to each other. As a result, the characteristics of the non-reciprocal circuit elements vary.

SUMMARY OF THE INVENTION

Preferred embodiments of the present invention provide a circuit module in which a plurality of non-reciprocal circuit elements, each of which does not have a yoke, are mounted, and in which magnetic coupling between the non-reciprocal circuit elements is significantly reduced and prevented.

A circuit module according to a preferred embodiment of the present invention includes a circuit board; and a first non-reciprocal circuit element and a second non-reciprocal circuit element each of which is mounted on the circuit board, generates magnetic flux in a direction parallel or substantially parallel to a principal surface of the circuit board, and does not have a yoke to reduce leakage of magnetic flux to an outside. The first non-reciprocal circuit element and the second non-reciprocal circuit element are arranged to significantly reduce and prevent magnetic coupling therebetween.

A circuit module according to another preferred embodiment of the present invention includes a circuit board; a first non-reciprocal circuit element and a second non-reciprocal circuit element each of which is mounted on the circuit board, generates magnetic flux in a direction parallel or substantially parallel to a principal surface of the circuit board, does not have a yoke to reduce leakage of magnetic flux to an outside; and a magnetic material arranged to prevent magnetic flux from entering the first non-reciprocal circuit element and the second non-reciprocal circuit element. A first recess and a second recess in which the first non-reciprocal circuit element and the second non-reciprocal circuit element are provided, respectively, are provided in the circuit board. The magnetic material is provided on a side surface of the first recess which is located between the first non-reciprocal circuit element and the second non-reciprocal circuit element.

According to various preferred embodiments of the present invention, in a circuit module in which a plurality of non-reciprocal circuit elements, each of which does not have a yoke, are mounted, occurrence of magnetic coupling between the non-reciprocal circuit elements is significantly reduced and prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a circuit module according to various preferred embodiments of the present invention will be described with reference to the drawings.

Figure 1:
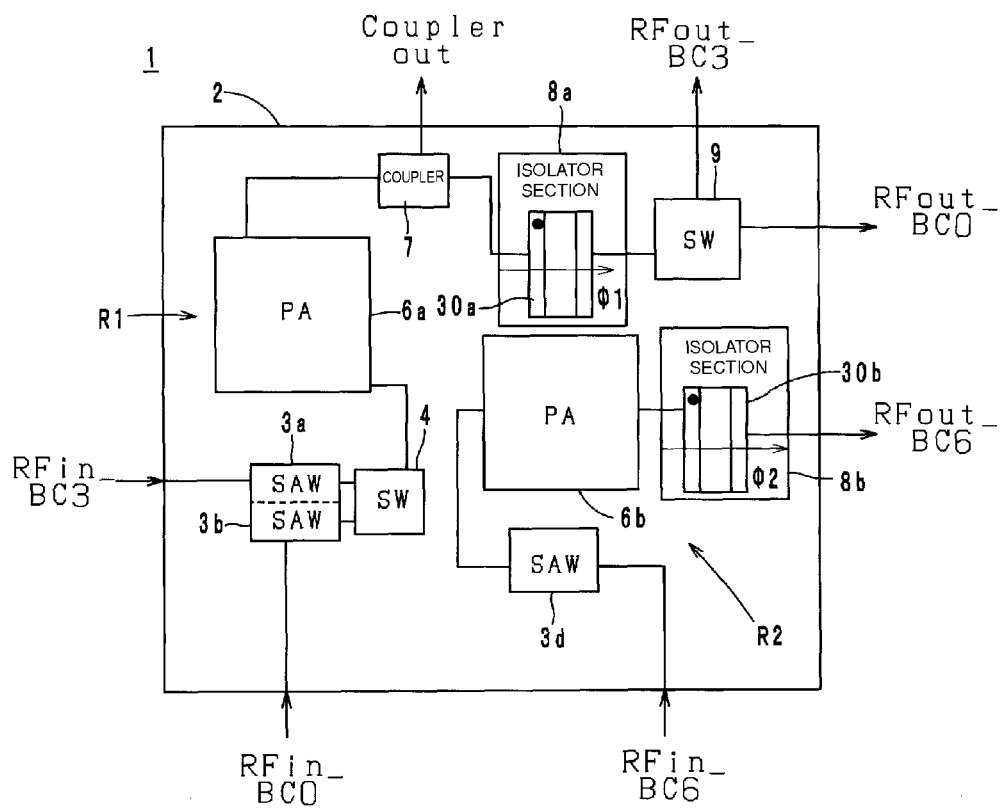
FIG. 1 is an arrangement diagram of electronic components mounted on a circuit module according to a preferred embodiment of the present invention.
Figure 2:
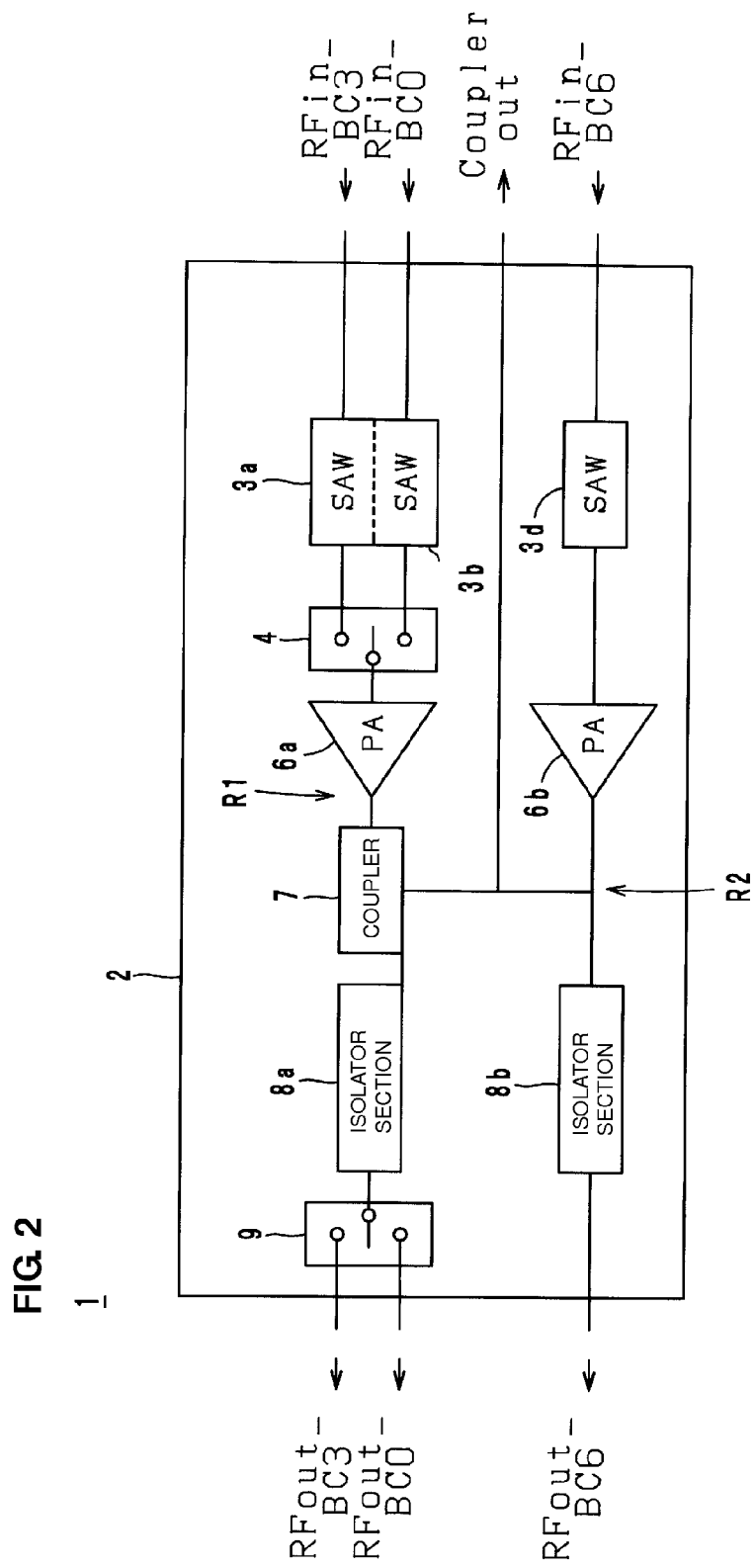
FIG. 2 is a block diagram of the circuit module in FIG. 1.

First, the configuration of the circuit module will be described with reference to the drawings. FIG. 1 is an arrangement diagram of electronic components mounted on a circuit module 1 according to a preferred embodiment of the present invention. FIG. 2 is a block diagram of the circuit module 1 in FIG. 1. In FIG. 1, only major electronic components are shown, and minor electronic components such as chip capacitors and chip inductors are omitted.

The circuit module 1 preferably constitutes a portion of a transmission circuit of a wireless communication apparatus such as a cellular phone, and amplifies and outputs multiple types of radio-frequency signals. The circuit module 1 includes a circuit board 2 and transmission paths R1 and R2. The circuit board 2 is a plate-shaped multilayer printed board on which and in which electric circuits are located.

The transmission path R1 amplifies and outputs input signals RFin_BC0 (800 MHz band) and RFin_BC3 (900 MHz band) as output signals RFout_BC0 (800 MHz band) and RFout_BC3 (900 MHz band). The transmission path R1 preferably includes SAW filters (surface acoustic wave filters) 3a and 3b, a switch 4, a power amplifier (amplifier) 6a, a coupler 7, an isolator section 8a, and a switch 9. As shown in FIG. 1, the SAW filters 3a and 3b, the switch 4, the power amplifier 6a, the coupler 7, the isolator section 8a, and the switch 9 are electronic components mounted on the circuit board 2.

As shown in FIG. 1, the SAW filters 3a and 3b are preferably defined by one electronic component, and are band-pass filters, each of which passes only a signal of a predetermined frequency. The SAW filters 3a and 3b are electrically connected to an input terminal (not shown) of the power amplifier 6a via the switch 4. The input signal RFin_BC3 is inputted to the SAW filter 3a. In addition, the input signal RFin_BC0 is inputted to the SAW filter 3b.

The switch 4 is connected to the SAW filters 3a and 3b and the power amplifier 6a, and outputs either the input signal RFin_BC3 outputted from the SAW filter 3a or the input signal RFin_BC0 outputted from the SAW filter 3b, to the power amplifier 6a.

The power amplifier 6a amplifies the input signal RFin_BC0 or RFin_BC3 outputted from the switch 4. The power amplifier 6a is connected to an input terminal (not shown) of the coupler 7 at the subsequent stage. The coupler 7 is connected to an input terminal (not shown) of the isolator 8a. The coupler 7 separates and outputs a portion of the input signal RFin_BC0 or RFin_BC3 amplified by the power amplifier 6a, as an output signal Coupler out to the outside of the circuit module 1, and outputs the input signal RFin_BC0 or RFin_BC3 to the isolator section 8a at the subsequent stage. The isolator section 8a is a non-reciprocal circuit element that outputs the input signal RFin_BC0 or RFin_BC3 to the switch 9 at the subsequent stage and that does not output, to the coupler 7 side, a signal reflected from the switch 9 side. The isolator section 8a will be described in detail later. The switch 9 outputs the input signal RFin_BC0 or RFin_BC3 outputted from the isolator section 8a, as an output signal RFout_BC0 or RFout_BC3 to the outside of the circuit module 1.

The transmission path R2 amplifies and outputs an input signal RFin_BC6 (1900 MHz band) as an output signal RFout_BC6 (1900 MHz band). The transmission path R2 preferably includes a SAW filter 3d, a power amplifier 6b, and an isolator section 8b. As shown in FIG. 1, the SAW filter 3d, the power amplifier 6b, and the isolator section 8b are electronic components mounted on the circuit board 2.

The SAW filter 3d preferably is a band-pass filter that passes only a signal of a predetermined frequency. The input signal RFin_BC6 is inputted to the SAW filter 3d.

The power amplifier 6b amplifies the input signal RFin_BC6 outputted from the SAW filter 3d. The isolator section 8b is a non-reciprocal circuit element that outputs the input signal RFin_BC6 to the outside of the circuit module 1 and that does not output, to the power amplifier 6b side, a signal reflected from the outside of the circuit module 1. The isolator section 8b will be described in detail later.

Figure 3:
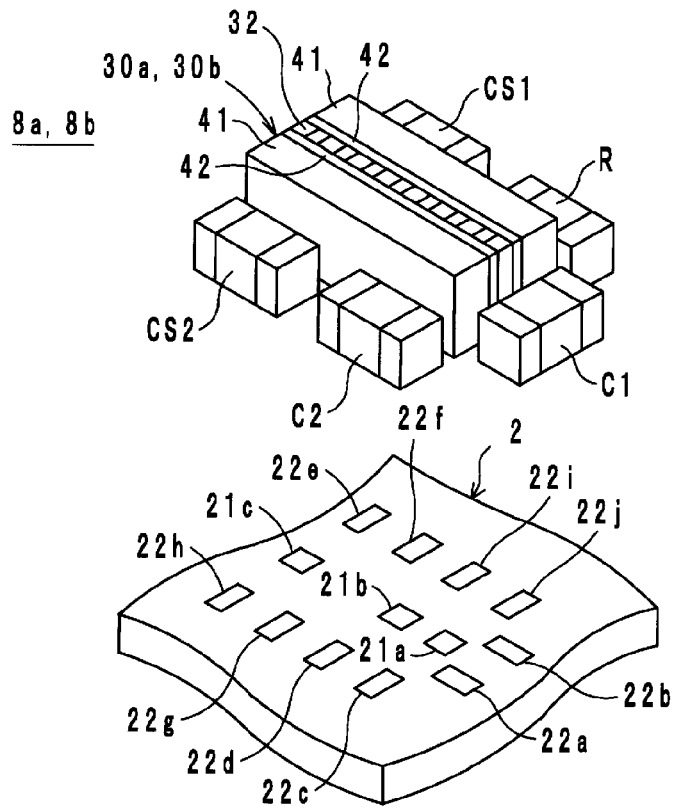
FIG. 3 is an external perspective view of an isolator section.
Figure 4:
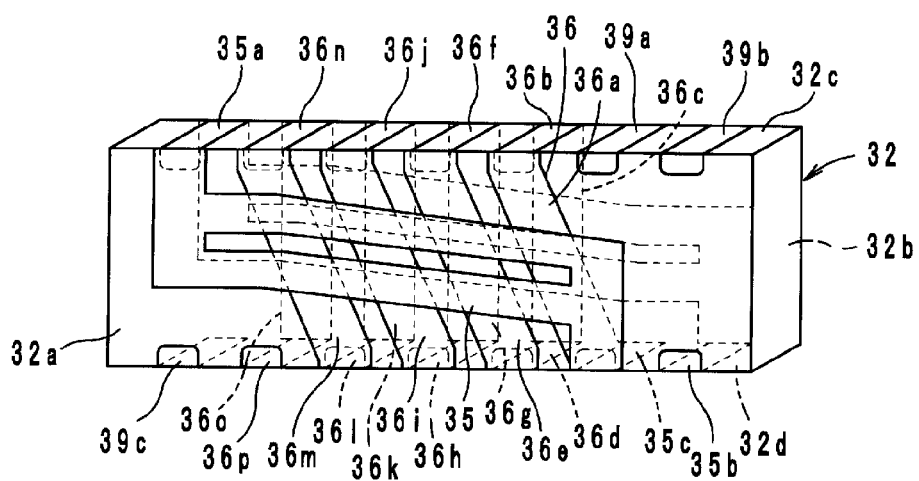
FIG. 4 is an external perspective view of a ferrite on which center electrodes are provided.
Figure 5:
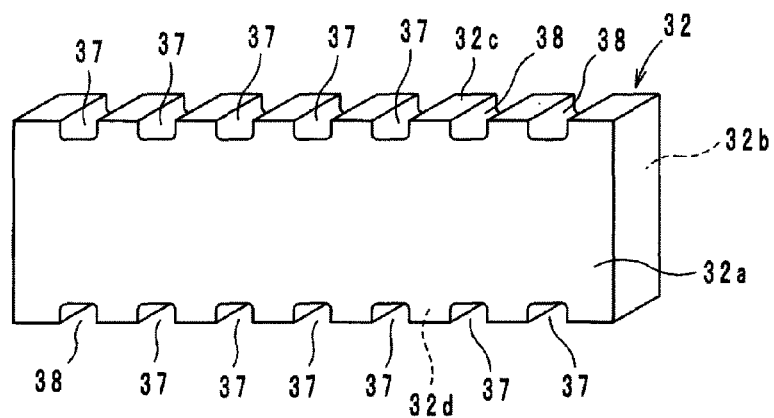
FIG. 5 is an external perspective view of the ferrite.
Figure 6:
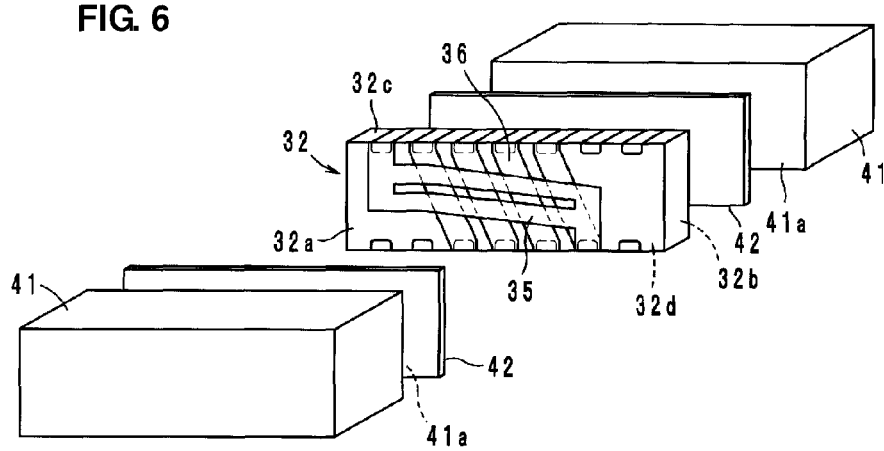
FIG. 6 is an exploded perspective view of a core isolator.

Hereinafter, the isolator sections 8a and 8b will be described with reference to the drawings. FIG. 3 is an external perspective view of the isolator section 8a or 8b. FIG. 4 is an external perspective view of a ferrite 32 on which center electrodes 35 and 36 are provided. FIG. 5 is an external perspective view of the ferrite 32. FIG. 6 is an exploded perspective view of the core isolator 30a or 30b.

The isolator section 8 (8a or 8b) preferably is a lumped constant isolator, and preferably includes the circuit board 2, the core isolator 30 (30a or 30b), capacitors C1, C2, CS1, and CS2, and a resistor R as shown in FIG. 3.

As shown in FIG. 3, the core isolator 30 preferably includes the ferrite 32 and a pair of permanent magnets 41. As shown in FIG. 4, in the ferrite 32, the center electrodes 35 and 36 are provided on front and back principal surfaces 32a and 32b thereof so as to be electrically insulated from each other. The ferrite 32 preferably has a rectangular parallelepiped shape including the opposing principal surfaces 32a and 32b that are parallel or substantially parallel to each other.

The permanent magnets 41 are attached to the principal surfaces 32a and 32b, for example, through an epoxy adhesive 42 such that a direct-current field is applied to the ferrite 32 in a direction substantially perpendicular to the principal surfaces 32a and 32b (see FIG. 6). A principal surface 41a of each permanent magnet 41 preferably has the same dimension as the dimensions of the principal surfaces 32a and 32b of the ferrite 32. The ferrite 32 and the permanent magnets 41 are preferably arranged so as to face each other in a state where the outer shapes of the principal surfaces 32a and 32b correspond to the outer shapes of the principal surfaces 41a.

The center electrode 35 is a conductor film. In other words, as shown in FIG. 4, on the principal surface 32a of the ferrite 32, the center electrode 35 extends upward from the lower right portion and inclines at a relatively low angle relative to a long side of the principal surface 32a in a state of branching into two portions. Then, the center electrode 35 extends upward to the upper left portion and turns to the principal surface 32b through an intermediate electrode 35a on an upper surface 32c of the ferrite 32. Furthermore, the center electrode 35 is arranged on the principal surface 32b so as to branch into two portions that overlap those on the principal surface 32a in perspective view. One end of the center electrode 35 is connected to a connection electrode 35b located on a lower surface 32d of the ferrite 32. The other end of the center electrode 35 is connected to a connection electrode 35c located on the lower surface 32d. In this manner, the center electrode 35 is wound on the ferrite 32 by one turn. The center electrode 35 and the center electrode 36, which will be described below, intersect each other so as to be insulated from each other, by providing an insulating film therebetween. The angle at which the center electrodes 35 and 36 intersect each other is set according to need, whereby the input impedance and the insertion loss are adjusted.

The center electrode 36 is a conductor film. In the center electrode 36, a 0.5-turn portion 36a is provided on the principal surface 32a so as to extend upwardly from lower right to upper left at a relatively high angle relative to the long side of the principal surface 32a and so as to intersect the center electrode 35. The 0.5-turn portion 36a turns to the principal surface 32b through an intermediate electrode 36b on the upper surface 32c. A one-turn portion 36c is provided on the principal surface 32b so as to substantially perpendicularly intersect the center electrode 35. A lower end portion of the one-turn portion 36c turns to the principal surface 32a through an intermediate electrode 36d on the lower surface 32d, and a 1.5-turn portion 36e is provided on the principal surface 32a so as to be parallel or substantially parallel to the 0.5-turn portion 36a and so as to intersect the center electrode 35. The 1.5-turn portion 36e turns to the principal surface 32b through an intermediate electrode 36f on the upper surface 32c. Similarly, a 2-turn portion 36g, an intermediate electrode 36h, a 2.5-turn portion 36i, an intermediate electrode 36j, a 3-turn portion 36k, an intermediate electrode 36l, a 3.5-turn portion 36m, an intermediate electrode 36n, and a 4-turn portion 36o are provided on the surface of the ferrite 32. Both ends of the center electrode 36 are connected to the connection electrodes 35c and 36p, respectively, provided on the lower surface 32d of the ferrite 32. The connection electrode 35c is shared as a connection electrode at an end of each of the center electrode 35 and the center electrode 36.

The connection electrodes 35b, 35c, and 36p and the intermediate electrodes 35a, 36b, 36d, 36f, 36h, 36j, 36l, and 36n are provided preferably by applying an electrode conductor such as silver, a silver alloy, copper, or a copper alloy to recesses 37 (see FIG. 5) formed on the upper surface 32c and the lower surface 32d of the ferrite 32 or filling the recesses 37 with the electrode conductor, for example. In addition, recesses 38 are provided on the upper surface 32c and the lower surface 32d so as to be parallel or substantially parallel to the various electrodes, and dummy electrodes 39a, 39b, and 39c are provided thereon. Such electrodes are formed preferably by previously forming through holes in a mother ferrite board, filling the through holes with an electrode conductor, and then cutting the mother ferrite board at positions where the through holes are to be divided. The various electrodes may be formed as conductor films in the recesses 37 and 38, for example.

As the ferrite 32, a YIG ferrite or the like is preferably used, for example. The center electrodes 35 and 36 and the various electrodes can preferably be formed as thick films or thin films of silver or a silver alloy by a method such as printing, transferring, or photolithography, for example. As the insulating film between the center electrodes 35 and 36, a dielectric thick film of glass, alumina, or the like, a resin film of polyimide or the like, or the like can preferably be used, for example. These films can be also formed by a method such as printing, transferring, or photolithography, for example.

It should be noted the ferrite 32 including the insulating film and the various electrodes can be collectively baked using a magnetic material. In this case, Pd, Ag, or Pd/Ag, which are resistant to baking at high temperatures, is preferably used to form the various electrodes, for example.

For the permanent magnets 41, strontium, barium, or lanthanum-cobalt ferrite magnets are preferably used, for example. A one-part thermosetting epoxy adhesive is preferably used as the adhesive 42 that adheres the permanent magnets 41 and the ferrite 32, for example.

The circuit board 2 is preferably formed from the same type of a material as that of a general multilayer printed circuit board. Terminal electrodes 21a, 21b, 21c, and 22a to 22j for mounting the core isolator 30, the capacitors C1, C2, CS1, and CS2, and the resistor R, input/output electrodes, a ground electrode (not shown), and the like, are provided on a surface of the circuit board 2.

The core isolator 30 is mounted on the circuit board 2. Specifically, the connection electrodes 35b, 35c, and 36p on the lower surface 32d of the ferrite 32 are unified with the terminal electrodes 21a, 21b, and 21c on the circuit board 2 by reflow soldering, and the bottoms of the permanent magnets 41 are unified with the circuit board 2 by an adhesive, for example. In addition, the capacitors C1, C2, CS1, and CS2 and the resistor R are reflow-soldered to the terminal electrodes 22a to 22j on the circuit board 2, for example. The core isolator 30, the capacitors C1, C2, CS1, and CS2, and the resistor R are connected to each other via wires in the circuit board 2 and constitute the isolator section 8.

Figure 7:
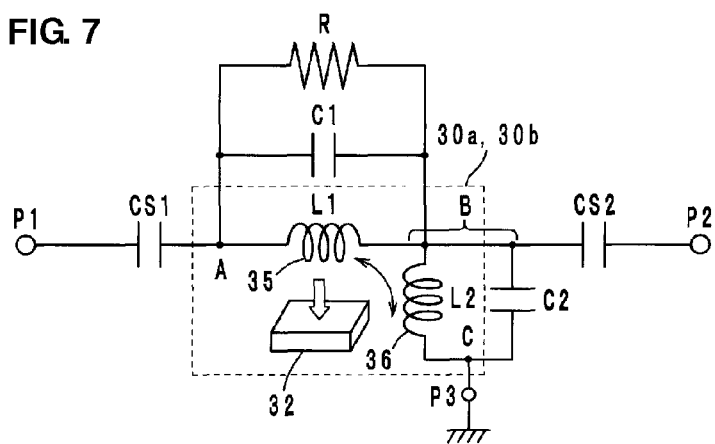
FIG. 7 is an equivalent circuit diagram of the isolator section.

Next, the circuit configurations of the isolator sections 8a and 8b will be described with reference to the drawing. FIG. 7 is an equivalent circuit diagram of the isolator section 8a or 8b.

An input port P1 is connected to the capacitor C1 and the resistor R through the capacitor CS1. The capacitor CS1 is connected to one end of the center electrode 35. The other end of the center electrode 35 and one end of the center electrode 36 are connected to the resistor R and the capacitors C1 and C2, and connected to an output port P2 via the capacitor CS2. The other end of the center electrode 36 and the capacitor C2 are connected to a ground port P3.

In the isolator sections 8a and 8b each including the equivalent circuit described above, the one end of the center electrode 35 is connected to the input port P1, the other end of the center electrode 35 is connected to the output port P2, the one end of the center electrode 36 is connected to the output port P2, and the other end of the center electrode 36 is connected to the ground port P3. Thus, each of the isolators 8a and 8b can be provided as a two-port lumped constant isolator having low insertion loss. In addition, during operation, a great radio-frequency signal flows in the center electrode 36, and a radio-frequency signal hardly flows in the center electrode 35.

Furthermore, since the ferrite 32 and the pair of permanent magnets 41 are unified with each other by the adhesive 42, for example, the core isolator 30 becomes mechanically stable to be a hard isolator that does not deform and break due to vibrations or shocks.

Meanwhile, the isolator sections 8a and 8b each do not have a yoke to reduce leakage of magnetic flux to the outside of the isolator section 8a or 8b. Thus, when a radio-frequency signal flows in each of the isolator sections 8a and 8b, magnetic flux occurs around each of the core isolators 30a and 30b. Depending on the arrangement of the core isolators 30a and 30b, a problem arises that the core isolators 30a and 30b are magnetically coupled to each other and desired characteristics cannot be obtained at the isolator sections 8a and 8b.

Thus, in the circuit module 1, the core isolator 30a and the core isolator 30b are arranged so as to significantly reduce and prevent magnetic coupling therebetween. Specifically, when a radio-frequency signal flows in each of the core isolators 30a and 30b, magnetic flux $\phi 1$ and $\phi 2$ occur so as to extend through the core isolators 30a and 30b in a direction parallel or substantially parallel to the principal surface of the circuit board 2 and toward the direction in which the ferrite 32 and the permanent magnets 41 are stacked (see FIG. 1). If the magnetic flux $\phi 1$ extends through the core isolator 30b in a state of being directed in the same direction as that of the magnetic flux $\phi 2$ (or if the magnetic flux $\phi 2$ extends through the core isolator 30a in a state of being directed in the same direction as that of the magnetic flux $\phi 1$), the core isolator 30a and the core isolator 30b are magnetically coupled to each other. It should be noted that in FIG. 1, for easy understanding, filled circles are assigned to the input sides of the core isolators 30a and 30b (the upstream sides of the magnetic flux $\phi 1$ and $\phi 2$).

Thus, the core isolators 30a and 30b are not arranged such that in a state where the direction of the magnetic flux $\phi 1$ and the direction of the magnetic flux $\phi 2$ are the same, the core isolators 30a and 30b are aligned in the direction of the magnetic flux $\phi 1$ and $\phi 2$. In the present preferred embodiment, the core isolators 30a and 30b generate the magnetic flux $\phi 1$ and $\phi 2$ from left to right as shown in FIG. 1. It should be noted that the core isolators 30a and 30b are arranged so as to incline relative to the magnetic flux $\phi 1$ and $\phi 2$. In other words, as shown in FIG. 1, the core isolator 30a is disposed on the upper left side, and the core isolator 30b is disposed on the lower right side. By so doing, the magnetic flux $\phi 1$ does not extend through the core isolator 30b in a state of being directed in the same direction as that of the magnetic flux $\phi 2$ (or the magnetic flux $\phi 2$ does not extend through the core isolator 30a in a state of being directed in the same direction as that of the magnetic flux $\phi 1$). As a result, occurrence of magnetic coupling between the core isolator 30a and the core isolator 30b is significantly reduced and prevented.

Furthermore, in the present preferred embodiment, the power amplifier 6b and the switch 9 are disposed preferably between the core isolator 30a and the core isolator 30b. By so doing, extension of the magnetic flux φ1 and φ2, which is generated by the core isolators 30a and 30b, through the core isolators 30b and 30a is significantly reduced and prevented. As a result, occurrence of magnetic coupling between the core isolator 30a and the core isolator 30b is more effectively reduced and prevented.

Figure 8:
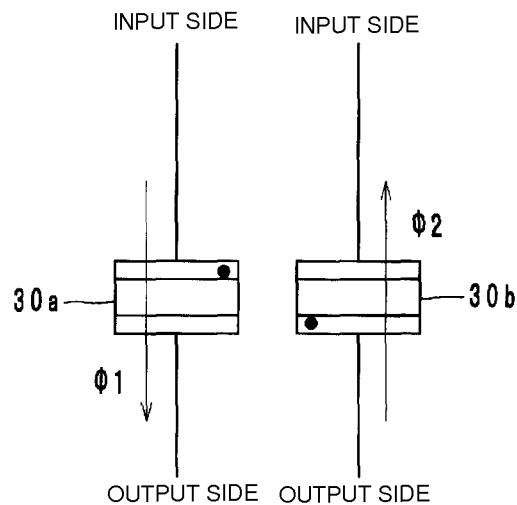
FIG. 8 is a diagram showing the arrangement of core isolators in a circuit module according to a first modification.
Figure 9:
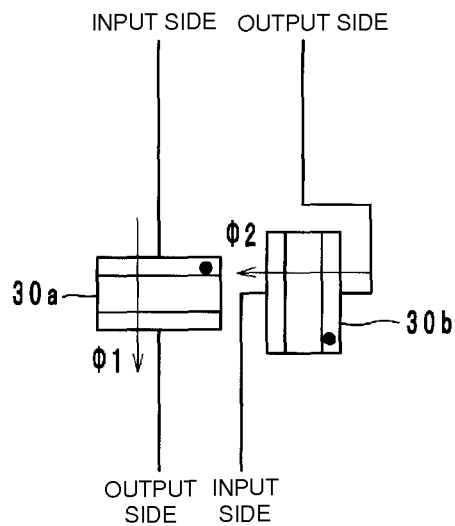
FIG. 9 is a diagram showing the arrangement of core isolators in a circuit module according to a second modification.

Hereinafter, the circuit modules 1 according to modifications of the preferred embodiment of the present invention described above will be described with reference to the drawings. FIG. 8 is a diagram showing the arrangement of the core isolators 30a and 30b in the circuit module 1 according to a first modification. FIG. 9 is a diagram showing the arrangement of the core isolators 30a and 30b in the circuit module 1 according to a second modification.

In the circuit module 1 according to the first modification, the core isolators 30a and 30b are aligned in a direction perpendicular or substantially perpendicular to the directions of the magnetic flux φ1 and φ2 in a state where the direction of the magnetic flux φ1 is opposite to the direction of the magnetic flux φ2. When the core isolators 30a and 30b are close to each other, the magnetic flux φ1 extends through the core isolator 30b in a state of being directed in the direction opposite to the direction of the magnetic flux φ2. Similarly, when the core isolators 30a and 30b are close to each other, the magnetic flux φ2 extends through the core isolator 30a in a state of being directed in the direction opposite to that of the magnetic flux φ1. Thus, the magnetic flux φ1 does not extend through the core isolator 30b in a state of being directed in the same direction as that of the magnetic flux φ2 (or the magnetic flux φ2 does not extend through the core isolator 30a in a state of being directed in the same direction as that of the magnetic flux φ1). As a result, magnetic coupling between the core isolator 30a and the core isolator 30b is significantly reduced and prevented.

In the circuit module 1 according to the second modification of a preferred embodiment of the present invention, the core isolators 30a and 30b are arranged such that the magnetic flux φ1 and the magnetic flux φ2 are perpendicular or substantially perpendicular to each other and the magnetic flux φ2 extends through the core isolator 30a. By so doing, the magnetic flux φ2 extends through the core isolator 30a in a state of being perpendicular or substantially perpendicular to the magnetic flux φ1. Thus, the magnetic flux φ1 does not extend through the core isolator 30b in a state of being directed in the same direction as that of the magnetic flux φ2 (or the magnetic flux φ2 does not extend through the core isolator 30a in a state of being directed in the same direction that of the magnetic flux φ1). As a result, magnetic coupling between the core isolator 30a and the core isolator 30b is significantly reduced and prevented.

Figure 10:
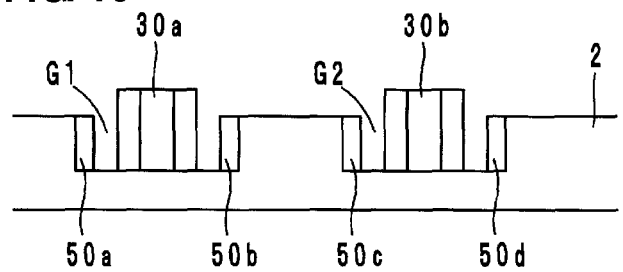
FIG. 10 is a cross-sectional structure diagram perpendicular to a principal surface of a circuit board of a circuit module.

Next, a circuit module 1' according to a third modification will be described with reference to the drawing. FIG. 10 is a cross-sectional structure diagram perpendicular to a principal surface of the circuit board 2 of the circuit module 1'.

In the circuit module 1', recesses G1 and G2 are provided in the circuit board 2. The core isolators 30a and 30b are provided in the recesses G1 and G2, respectively. By so doing, the height of the circuit module 1' is reduced.

Furthermore, magnetic materials 50a to 50d are provided on side surfaces of the recesses G1 and G2 on the principal surface of the circuit board 2. Specifically, the magnetic materials 50b and 50c are provided on the side surfaces of the recesses G1 and G2 which are located between the core isolator 30a and the core isolator 30b. In addition, the magnetic materials 50a and 50d are provided on the side surfaces of the recesses G1 and G2 which are not located between the core isolator 30a and the core isolator 30b. By so doing, entry of the magnetic flux φ1 and φ2 into the core isolators 30a and 30b within the recesses G1 and G2 is significantly reduced and prevented.

In the circuit module 1' described above, the magnetic materials 50b and 50c are provided between the core isolator 30a and the core isolator 30b. Thus, in the circuit module 1', extension of magnetic flux from the outside of the circuit module 1' through the core isolators 30a and 30b can be significantly reduced and prevented, and characteristic variations of the core isolators 30a and 30b can be significantly reduced and prevented.

The circuit modules 1 and 1' configured as described above are not limited to those shown in the preferred embodiments of the present invention described above. Thus, it is possible to change the designs of the circuit modules 1 and 1' within the scope of the present invention.

For example, as shown in FIG. 1, the power amplifier 6b and the switch 9 are arranged between the core isolator 30a and the core isolator 30b. The power amplifier 6b and the switch 9 may be, for example, inductors. In this case, the inductors suffice to be arranged so as to significantly reduce and prevent magnetic coupling between the core isolators 30a and 30b.

In addition, in the circuit modules 1 and 1', the frequency characteristics of the core isolators 30a and 30b have not been particularly described. The core isolator 30a and the core isolator 30b have the same frequency characteristics or may have different frequency characteristics. When the core isolator 30a and the core isolator 30b have different frequency characteristics, the core isolator 30a and the core isolator 30b are unlikely to be magnetically coupled to each other.

As described above, various preferred embodiments of the present invention are useful for circuit modules, and in particular, are excellent in being able to significantly reduce and prevent, in a circuit module in which a plurality of non-reciprocal circuit elements each of which does not have a yoke, are mounted, the occurrence of magnetic coupling between the non-reciprocal circuit elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
 a circuit board; and
 a first non-reciprocal circuit element and a second non-reciprocal circuit element each of which is mounted on the circuit board, generates magnetic flux in a direction parallel or substantially parallel to a principal surface of the circuit board, and does not have a yoke to reduce leakage of magnetic flux to an outside; wherein
 the first non-reciprocal circuit element and the second non-reciprocal circuit element are arranged to reduce magnetic coupling therebetween; and
 the first non-reciprocal circuit element and the second non-reciprocal circuit element are arranged such that the magnetic flux extending through the first non-reciprocal circuit element and the magnetic flux extending through the second non-reciprocal circuit element are perpendicular or substantially perpendicular to each other.

2. The circuit module according to claim 1, wherein the first non-reciprocal circuit element and the second non-reciprocal circuit element are arranged such that the magnetic flux extending through the second non-reciprocal circuit element extends through the first non-reciprocal circuit element.

3. The circuit module according to claim 1, wherein
a recess is provided in the circuit board; and
the first non-reciprocal circuit element and the second non-reciprocal circuit element are provided in the recess.

4. The circuit module according to claim 1, wherein the first non-reciprocal circuit element and the second non-reciprocal circuit element have different frequency characteristics.

5. The circuit module according to claim 1, further comprising:
a coupler connected to an input terminal of at least either one of the first non-reciprocal circuit element or the second non-reciprocal circuit element;
an amplifier connected to an input terminal of the coupler; and
a surface acoustic wave filter connected to an input terminal of the amplifier.

6. The circuit module according to claim 1, further comprising an electronic component disposed between the first non-reciprocal circuit element and the second non-reciprocal circuit element.

7. The circuit module according to claim 6, wherein
the electronic component is an inductor; and
the inductor, the first non-reciprocal circuit element, and the second non-reciprocal circuit element are arranged so as to reduce magnetic coupling therebetween.

8. A circuit module comprising:
a circuit board;
a first non-reciprocal circuit element and a second non-reciprocal circuit element each of which is mounted on the circuit board, generates magnetic flux in a direction parallel or substantially parallel to a principal surface of the circuit board, and does not have a yoke to reduce leakage of magnetic flux to an outside; and
a magnetic material disposed between the first non-reciprocal circuit element and the second non-reciprocal circuit element on the circuit board to prevent magnetic flux from entering the first non-reciprocal circuit element and the second non-reciprocal circuit element.

9. A circuit module comprising:
a circuit board;
a first non-reciprocal circuit element and a second non-reciprocal circuit element each of which is mounted on the circuit board, generates magnetic flux in a direction parallel or substantially parallel to a principal surface of the circuit board, does not have a yoke to reduce leakage of magnetic flux to an outside; and
a magnetic material arranged to prevent magnetic flux from entering the first non-reciprocal circuit element and the second non-reciprocal circuit element; wherein
a first recess and a second recess in which the first non-reciprocal circuit element and the second non-reciprocal circuit element are provided, respectively, are provided in the circuit board; and
the magnetic material is provided on a side surface of the first recess which is located between the first non-reciprocal circuit element and the second non-reciprocal circuit element.

10. The circuit module according to claim 9, wherein the first non-reciprocal circuit element and the second non-reciprocal circuit element have different frequency characteristics.

11. The circuit module according to claim 9, further comprising:
a coupler connected to an input terminal of at least either one of the first non-reciprocal circuit element or the second non-reciprocal circuit element;
an amplifier connected to an input terminal of the coupler; and
a surface acoustic wave filter connected to an input terminal of the amplifier.

* * * * *